United States Patent [19]

Suehiro

[11] Patent Number: 5,021,857
[45] Date of Patent: Jun. 4, 1991

[54] TWO DIMENSIONAL ELECTRON GAS SEMICONDUCTOR DEVICE

[75] Inventor: Haruyoshi Suehiro, Atsugi, Japan

[73] Assignee: Fujitsu Limited, Kawasaki, Japan

[21] Appl. No.: 442,853

[22] Filed: Nov. 29, 1989

[30] Foreign Application Priority Data

Nov. 29, 1988 [JP] Japan .................................. 63-299559

[51] Int. Cl.⁵ .................... H01L 27/02; H01L 29/161; H01L 29/80; H01L 29/78
[52] U.S. Cl. ......................................... 357/42; 357/16; 357/22; 357/23.12; 357/56
[58] Field of Search ................... 357/16, 56, 22 A, 42, 357/23.12, 22 K, 22 G, 22 D, 22 MD; 29/571

[56] References Cited

U.S. PATENT DOCUMENTS

| | | | |
|---|---|---|---|
| 4,615,102 | 10/1986 | Suzuki et al. | 29/571 |
| 4,635,343 | 1/1987 | Kuroda | 29/571 |
| 4,733,283 | 3/1988 | Kuroda | 357/16 X |
| 4,742,379 | 5/1988 | Yamashita et al. | 357/16 X |

FOREIGN PATENT DOCUMENTS

| | | | |
|---|---|---|---|
| 0152126 | 8/1985 | European Pat. Off. | 357/16 |
| 0175437 | 3/1986 | European Pat. Off. | 357/16 |
| 3706274 | 9/1987 | Fed. Rep. of Germany | 357/16 |
| 60-231368 | 11/1985 | Japan . | |
| 62-202564 | 9/1987 | Japan . | |

OTHER PUBLICATIONS

Fujitsu Scientific Technical Journal, vol. 21; No. 3, Jul. 1985, pp. 370-379, Kawasaki, JP; T. Mimura et al.: High electron mobility transistors.

European Search Report—EP 89 31 2120.

Primary Examiner—William Mintel
Assistant Examiner—Roy Potter
Attorney, Agent, or Firm—Staas & Halsey

[57] ABSTRACT

A semiconductor device composed of an E-mode transistor and a D-mode transistor and utilizing a two-dimensional electron gas, comprising: a semi-insulating substrate (41); a channel layer (42); a carrier-supply layer (43); a threshold voltage adjusting layer (44); a first etching-stoppable layer (45); an ohmic-contactable layer; a second etching-stoppable layer (49); and a contact cap layer (50), these layers being epitaxially and successively formed on the substrate (41); source and drain electrodes (60-63) formed on the contact cap layer (50); a first gate electrode (66) of the E-mode transistor formed in a first recess (57E); and a second gate electrode (67) of the D-mode transistor formed in a second recess (57D); characterized in that the device further comprises a third etching-stoppable layer (47) which is formed in the ohmic-contactable layer to divide it into an upper portion layer (48) and a lower portion layer (46) thinner than the upper layer (48). In the formation of the first recess (57E), the upper portion layer (48) and the lower portion layer (46) are selectively and isotropically etched, and in the formation of the second recess (57D), the contact cap layer (50) and the upper portion layer (48) are selectively and isotropically etched.

8 Claims, 12 Drawing Sheets

TWO DIMENSIONAL ELECTRON GAS SEMICONDUCTOR DEVICE

BACKGROUND OF THE INVENTION

1. Field of the Invention

The present invention relates to a semiconductor device comprising an enhancement-mode (E-mode) field-effect transistor (FET) and a depletion-mode (D-mode) FET which are operated at a high speed by using a two dimensional electron gas (2 DEG), and to a method of producing the semiconductor device.

2. Description of the Related Art

Each of the above-mentioned FETs has a heterojunction and is well-known as a high electron mobility transistor (HEMT).

In general, the above FET's comprise a semi-insulating gallium-arsenide (GaAs) substrate, an undoped GaAs channel layer, an n-type aluminum-gallium-arsenide (AlGaAs) electron-supply layer, and an n-type GaAs cap layer, which layers are successively formed on the substrate. A threshold voltage Vth of the FET depends on the thickness of a semiconductor layer including the n-type AlGaAs electron-supply layer between the undoped GaAs channel layer and a contacting bottom portion of a gate electrode. This thickness is controlled to a depth of a gate electrode recess formed in the semiconductor layers by an etching process.

Furthermore, integrated circuit devices composed of HEMTs, DCFL (direct coupled FET logic) circuits are widely used as basic inverter circuits. The inverter circuit has an enhancement/depletion (E/D) constitution comprising an E-mode HEMT at a drive side and a D-mode HEMT at a load side. In an E/D constitution semiconductor device for the inverter circuit, it is necessary to form the E-mode HEMT having one threshold voltage and the D-mode HEMT having another threshold voltage in the same semiconductor substrate.

Current demands for an increase in the speed of computer systems have led to the development of compound semiconductor integrated circuit devices having a very high-speed operation.

In order to meet the above demand, it is necessary not only to improve the high-speed operation but also to increase the reliability of these devices, and therefore in the HEMTs constituting the integrated circuit device, the gate length of the HEMT is shortened to enable improve a higher speed operation. Further, it is necessary to provide the following properties:

(a) low source resistance Rs;
(b) small parasitic capacitance Cp; and
(c) excellent gate properties including a high gate breakdown voltage.

Furthermore, it is necessary to easily and simultaneously form the E-mode and D-mode HEMTs having the above properties on the same semiconductor substrate.

A method of producing the E/D constitution semiconductor device in which the E-mode and D-mode HEMTs are simultaneously formed on the same substrate has been proposed, for example, in U.S. Pat. No. 4,615,102. According to this U.S. Patent, the semiconductor device is produced in the following manner (refer to FIGS. 1 to 8).

As illustrated in FIG. 1, on a semi-insulating GaAs substrate 1, an undoped GaAs channel layer (a first semiconductor layer) 2, an n-type AlGaAs electron-supply layer (a second semiconductor layer having an electron affinity smaller than that of the GaAs layer 2) 3, an n-type GaAs threshold voltage adjusting layer for the D-mode HEMT (a third semiconductor layer) 4, an n-type AlGaAs first stoppable layer (a fourth semiconductor layer) 5, an n-type GaAs ohmic-contactable layer (a fifth semiconductor layer) 6, an n-type AlGaAs second etching-stoppable layer (a sixth semiconductor layer) 7, and an n-type GaAs ohmic-contactable layer (a seventh semiconductor layer) 8 are formed (i.e., epitaxially grown) in sequence by a molecular beam epitaxy (MBE) method or a metal organic chemical vapor deposition (MOCVD) method.

As illustrated in FIG. 2, to isolate the E-mode HEMT and the D-mode HEMT from each other, the semiconductor layers 8 to 2 and the semiconductor substrate 1 are selectively etched by a wet etching method using a suitable etchant, e.g., hydrofluoric acid (HF), to form a groove 9, an E-mode transistor region "E" island, and a D-mode transistor region "D" island. This groove 9 extends into the substrate 1. In place of the etching treatment an ion-implantation treatment can be adopted, and in this case, oxygen ions or protons are doped into the portion corresponding to the groove 9 to form an insulating region.

As illustrated in FIG. 3, portions of the n-type GaAs layer 8 and the n-type AlGaAs layer 7 corresponding to a gate region of the E-mode transistor are selectively etched by a suitable etching method (e.g., a wet etching method using HF solution to form a recess 10 in the E region. A portion of the n-type GaAs layer 6 is exposed in the recess 10 and may be simultaneously etched.

As illustrated in FIG. 4, an insulating layer 11 being of, e.g., silicon dioxide ($SiO_2$), is formed over the whole of the exposed surface by a chemical vapor deposition (CVD) method. The insulating ($SiO_2$), layer 11 is coated with a resist layer (not shown) having openings and is then selectively etched by e.g., a wet etching method using an HF solution, to form contact openings therein. Leaving the resist layer, a metal film of AuGe/Au, AuGe/Ni/Au, AuGe/Ni, or the like is formed on the resist layer and the exposed portions of the seventh n-type GaAs layer 8 in the openings by a vapor deposition method. The resist layer is then removed by a suitable solvent, whereby a portion of the metal film on the resist layer is also removed. As the result of such a lift-off process, electrode metal portions 12, 13, 14, and 15 remain on the seventh n-type GaAs layer 8, and a heat treatment for alloying is carried out to form ohmic-contactable electrodes 12 to 15 of the source and drain electrodes of the E-mode and D-mode HEMTs.

As illustrated in FIG. 5, a resist layer (a masking layer) 16 is coated, exposed, and developed to form openings 17E and 17D for the formation of grooves for gate electrodes of the E-mode and D-mode transistors, respectively. By using the resist layer 16 as a mask, the $SiO_2$ layer 11 is etched through the openings 17E and 17D by, e.g., a wet etching method using an HF solution, so that openings 18E and 18D are formed in the $SiO_2$ layer 11. Then a selective dry etching treatment, in this case a reactive ion etching (RIE) treatment using an etchant gas comprising $CCl_2F_2$, is performed to anisotropically etch the fifth n-type GaAs layer 6 in the E region through the opening 17E and the seventh n-type GaAs layer 8 in the D region, to form openings 19E and 19D, respectively. The fourth n-type AlGaAs layer 5 in the E region and the sixth n-type AlGaAs layer 7 in the D region serve as etching-stoppable layers.

The above-mentioned RIE method using $CCl_2F_2$ gas can etch GaAs about 200 times faster than AlGaAs. The etching is automatically stopped at the surfaces of the n-type AlGaAs layer 5 and 7.

As illustrated in FIG. 6, the exposed portions of the AlGaAs layers 5 and 7 in the openings 17E to 19E and 17D to 19D are etched by, e.g., a wet etching method using an HF solution, to expose the third n-type GaAs layer 4 in the E region and the fifth n-type GaAs layer 6 in the D region. Since this etching treatment is performed for the purpose of removing a AlGaAs layer, and since the thickness of the AlGaAs layers 5 and 7 is thin, it is easy to control the etching of the AlGaAs layers 5 and 7 without the complete removal of the third and fifth GaAs layers 4 and 6. As the result of the etching, openings 20E and 20D are formed in the AlGaAs layers 5 and 7 and portions of the GaAs layer 4 and 6. It is possible to perform the etching treatment by a dry etching method.

As illustrated in FIG. 7, a selective dry etching (in this case, RIE) treatment using $CCl_2F_2$ gas is performed so as to etch the third GaAs layer 4 in the E region through the opening 17E and the fifth GaAs layer 6 in the D region through the opening 17D so that openings 21E and 21D are formed, respectively. The second n-type AlGaAs layer 3 in the E region and the fourth n-type AlGaAs layer 5 in the D region serve as etching-stoppable layers. As the result of the above-mentioned etching treatments, grooves 22E and 22D consisting of the openings 18E to 21E and 18D to 21D, respectively, are completed.

As illustrated in FIG. 8, a metal layer for a Schottky barrier of, e.g., aluminum (Al), is formed by, e.g., a vapor deposition method, on the remaining resist layer 16 and in the grooves 22E and 22D. The resist layer 16 is then removed by a suitable solvent, whereby a portion of the metal film on the resist layer 16 is also removed. As the result, metal portions, i.e., gate electrodes 23 and 24 of the E-mode and D-mode HEMTs, respectively are formed. Therefore, a semiconductor device comprising the E-mode and D-mode HEMTs is obtained.

According to the above-mentioned production method of the prior art, the etching treatments and the gate electrode formation through the openings 18E and 18D of the insulating layer 11 are performed in a self-alignment system, and it is possible to easily produce a semiconductor device comprising the E-mode and D-mode HEMTs and having accurately controlled threshold voltages Vth.

To increase the operation speed of a DCFL circuit composed of the E-mode and D-mode HEMTs shown in FIG. 8, it is necessary to enable the drive-side transistor, i.e., the E-mode HEMT, to operate at a higher speed. As an expedient to this end, the gate length of the E-mode HEMT is shortened to 1 μm or less, i.e., on the order of submicrons. But, in this case, a lowering of the source resistance Rs and the parasitic capacitance Cp become serious problems.

In the semiconductor device shown in FIG. 8, the regulation of the thickness of the n-type GaAs ohmic-contact layer 6 may be used to solve these problems. Since the n-type GaAs layer 4 serves to adjust the threshold voltage Vth, the thickness thereof is determined in accordance with the circuit performance conditions of the integrated circuit semiconductor device, and can not be easily changed. Furthermore, the n-type AlGaAs etching stoppable layers 5 and 7 are substantially formed in a thin state, and thus these layers can not be included in the parameters for solving the problems.

To lower the source resistance Rs of the E-mode transistor, the thickness of the n-type GaAs layer 6 can be increased, but as apparent from FIG. 8, the increased layer thickness involves an increase of the contact area between the layer 6 and the gate electrodes 23 and 24, with the result that the parasitic capacitance Cp is increased and a leakage current between the electrodes 23 and 24 and the layer 6 is also increased, whereby the gate breakdown voltage of the E-mode and D-mode transistors is lowered. On the other hand, to increase the gate breakdown voltage and to lower the parasitic capacitance Cp of the transistors, preferably the n-type GaAs layer 6 is made thinner. The thinned layer 6, however, brings an increase of the source resistance Rs and a lowering of the trans-conductance gm of the transistors.

An improved gate structure for the E/D constitution semiconductor device has been proposed, by which the above-mentioned antinomy is eliminated. This improved gate structure is formed in the following manner, referring to FIG. 9 and 10 in which the reference numerals and symbols used in FIG. 1 to 8 represent the same portions or corresponding portions of the device of FIGS. 1 to 8.

FIG. 9 shows a production stage corresponding to that shown in FIG. 5 of the prior art. In this case, the simultaneous etching step of the n-GaAs layer 6 in the E-mode portion and the n-GaAs layer 8 in the D-mode portion is carried out in an isotropic manner, instead of the anisotropic manner used in FIG. 5. Accordingly, the formed openings 19E and 19D extend in a transverse direction. The isotropic etching can be performed by controlling a gas pressure and a bias voltage in an RIE method using $CCl_2F_2$ etching gas, which maintains the high selectivity of GaAs to AlGaAs.

FIG. 10 shows a production stage corresponding to that shown in FIG. 8. The production steps up to this stage are the same as those carried out in FIGS. 6 to 8.

In the produced semiconductor device having the improved gate structure, the gate electrodes 23 and 24 do not come into contact with the n-type GaAs layers 6 and 8, respectively, as shown in FIG. 10. Therefore, the obtained semiconductor device exhibits a lower parasitic capacitance Cp and a smaller amount of leakage current to thereby improve the gate breakdown voltage, compared with the semiconductor device explained in connection with FIG. 1 to 8. Furthermore, since the gate electrode 23 of the E-mode region does not come into contact with the n-type GaAs layer 6, an increase of the thickness of the layer 6 for reducing the source resistance Rs does not cause an increase of the parasitic capacitance of the E-mode transistor.

Nevertheless, the increase of the thickness of the n-type GaAs layer 6 still causes an increase of the contact area between the gate electrode 24 and the layer 6 in the D-mode region, which increases the gate leakage current and reduces the gate breakdown voltage of the D-mode transistor, as mentioned above. Therefore, the deterioration of the gate properties of the D-mode transistor prevents the formation of Schottky diodes between the gate electrode 24 and the source and drain electrodes 14 and 15, hinders the designing of an integrated circuit, and lowers the reliability of the semiconductor device.

To solve the above-mentioned problem in the D-mode transistor, a simultaneous etching of the n-type GaAs layer 4 in the E-mode region and the n-type GaAs layer 6 in the D-mode region has been considered for forming the openings 21E and 21D shown in FIG. 7 in the isotropic manner instead of the anisotropic manner, so that the openings 21E and 21D extend in a transverse direction, as shown in FIG. 11. In this case, the gate electrode 24 is formed to not come into contact with the n-type GaAs layer 6, but a surface depletion layer of the E-mode transistor reaches the undoped GaAs channel layer 2 to hinder the operation of the E-mode transistor. Therefore, the last etching step for a formation of recesses (grooves) for the gate electrodes should be carried out anisotropically to bring a portion of the electrode 23 into contact with the layer 4.

In the above-mentioned explanation the E-mode and D-mode transistors are HEMTs utilizing a two-dimensional electron gas, but it is possible to use transistors utilizing a two-dimensional hole gas instead of the electron gas. A "two-dimensional carrier gas" includes the two dimensional electron gas and two-dimensional hole gas.

SUMMARY OF THE INVENTION

An object of the present invention is to provide an E/D constitution semiconductor device utilizing a two-dimensional carrier gas, an enhancement mode transistor of which has a small source resistance Rs, a small parasitic capacitance Cp, and a high breakdown voltage, and a depletion-mode transistor of which also has a high breakdown voltage.

Another object of the present invention is to provide a method of producing the above-mentioned improved E/D constitution semiconductor device.

Another object of the present invention is to provide the E/D constitution semiconductor device including E-mode and D-mode transistors having gate lengths of 1 μm or less.

The above and other objects of the present invention are attained by providing a semiconductor device composed of an enhancement-mode transistor and a depletion-mode transistor and utilizing a two-dimensional carrier gas, comprising a semi-insulating semiconductor substrate; a first semiconductor layer, which is a channel layer in which the two-dimensional carrier gas is generated; a second semiconductor layer which has an electron affinity smaller than that of the first semiconductor layer, to serve as a carrier-supply layer; a third semiconductor layer, which is a threshold voltage adjusting layer for the depletion-mode transistor and has an etch rate larger than that of the second semiconductor layer on a predetermined etchant; a fourth semiconductor layer, which is a first etching-stoppable layer; a fifth semiconductor layer, which is an ohmic-contactable layer and has an etch rate larger than that of the fourth semiconductor layer on the predetermined etchant; a sixth semiconductor layer, which is a second etching-stoppable layer; and a seventh semiconductor layer, which is a contact cap layer and has an etch rate larger than that of the sixth semiconductor layer on the predetermined etchant, the first to seventh semiconductor layers being epitaxially and successively formed on the substrate; source and drain electrodes partially lying on the seventh semiconductor layer, a first gate electrode for the enhancement-mode transistor formed in a first recess extending to the second semiconductor layer; a second gate electrode for the depletion-mode transistor formed in a second recess extending to the fourth semiconductor layer. The semiconductor device further comprises an eighth semiconductor layer, which is a third etching stoppable layer having an etch rate smaller than that of the fifth semiconductor layer on the predetermined etchant, formed in the fifth semiconductor layer to divide it into an upper portion layer and a lower portion layer thinner than the upper portion layer, wherein the first gate electrode does not come into contact with the fourth through seventh and eight semiconductor layers and the second gate electrode does not come into contact with the eighth semiconductor layer, the upper portion layer, and the sixth and seventh semiconductor layers.

The object of the present invention is also attained by providing a method of producing a semiconductor device composed of an enhancement-mode transistor and a depletion-mode transistor and utilizing a two-dimensional carrier gas, comprising the steps of: epitaxially and successively forming, on a semi-insulating semiconductor substrate a first semiconductor layer which is a channel layer, in which the two-dimensional carrier gas is generated, a second semiconductor layer which is a carrier-supply layer, a third semiconductor layer which is a threshold voltage adjusting layer for the depletion-mode transistor, a fourth semiconductor layer which is a first etching-stoppable layer; a fifth semiconductor layer which is an ohmic-contactable layer, a sixth semiconductor layer which is a second etching-stoppable layer, and a seventh semiconductor layer which is a contact cap layer; selectively etching the seventh and sixth semiconductor layers at an area corresponding to a first gate electrode of the enhancement-mode transistor; selectively etching the fifth, fourth and third semiconductor layers to form a first recess for the first gate electrode, and simultaneously, selectively etching the seventh, sixth and fifth semiconductor layers to form a second recess for a second gate electrode of the depletion-mode transistor; and simultaneously forming the first and second gate electrodes within the first and second recess, respectively; characterized in that the step of forming the fifth semiconductor layer is replaced by a step of epitaxially and successively forming a lower portion layer, an eighth semiconductor layer which is a third etching-stoppable layer, and an upper portion layer thicker than the lower portion layer on the fourth semiconductor layer wherein, in the etching step for the first recess, the upper portion layer and the lower portion layer are isotropically etched, and in the etching step for the second recess, the seventh semiconductor layer and the upper portion layer are isotropically etched.

According to the present invention, a gap (space) is formed between the gate electrode of the E-mode transistor and the lower portion layer and the upper portion layer of the fifth semiconductor layer, whereby the parasitic capacitance Cp is reduced and the gate breakdown voltage is increased. Furthermore, the upper portion layer is formed to a thickness large enough to reduce the source resistance Rs of the E-mode transistor. Since another gap (space) is formed between the gate electrode of the D-mode transistor and the upper portion layer of the fifth semiconductor layer, the formation of the lower portion layer having a required small thickness increases the gate breakdown voltage of the D-mode transistor. Namely, the lowering of the source resistance Rs of the E-mode transistor and the increase of the gate breakdown voltage are simultaneously obtained by dividing the fifth semiconductor layer into the thin lower portion layer and the thick upper portion layer.

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

Referring to FIGS. 12 through 22, a method of producing an E/D constitution semiconductor device in accordance with a preferred embodiment of the present invention is now explained.

Figure 1:
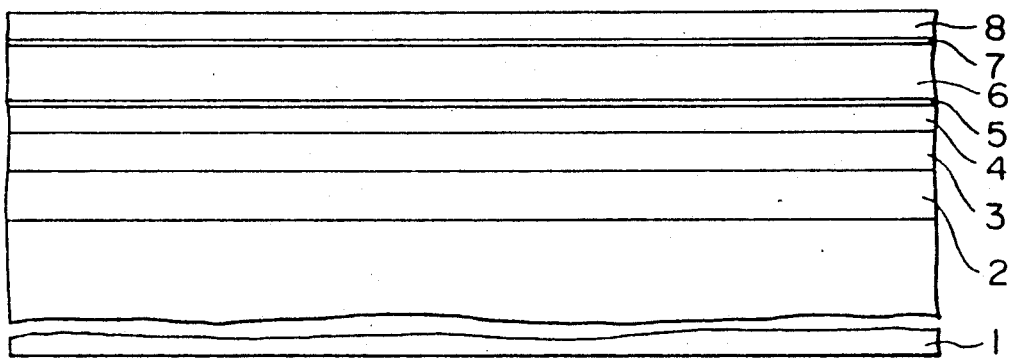
FIGS. 1 through 8 are schematic sectional views of an E/D constitution semiconductor device in various stages of production in accordance with a prior art technique.
Figure 2:
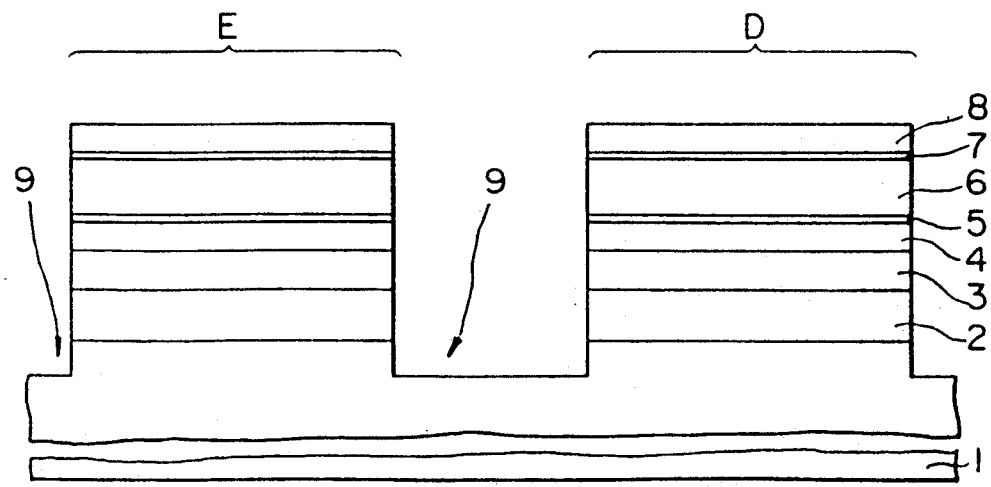
Figure 3:
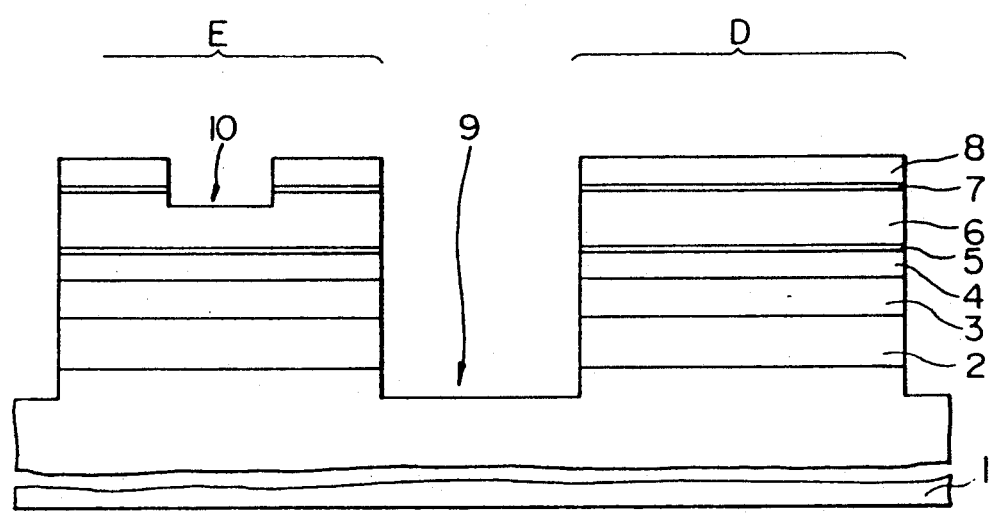
Figure 4:
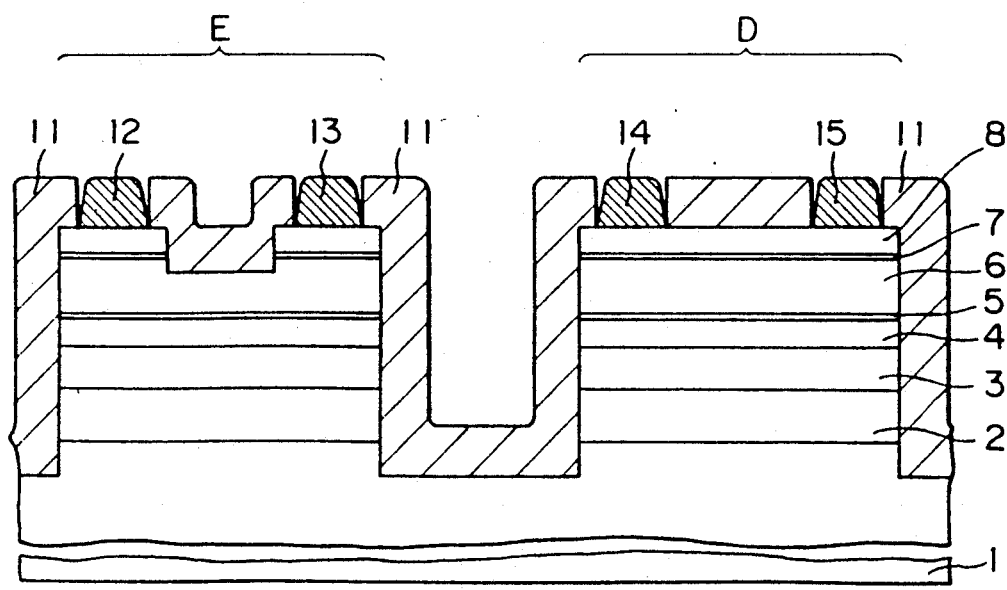
Figure 5:
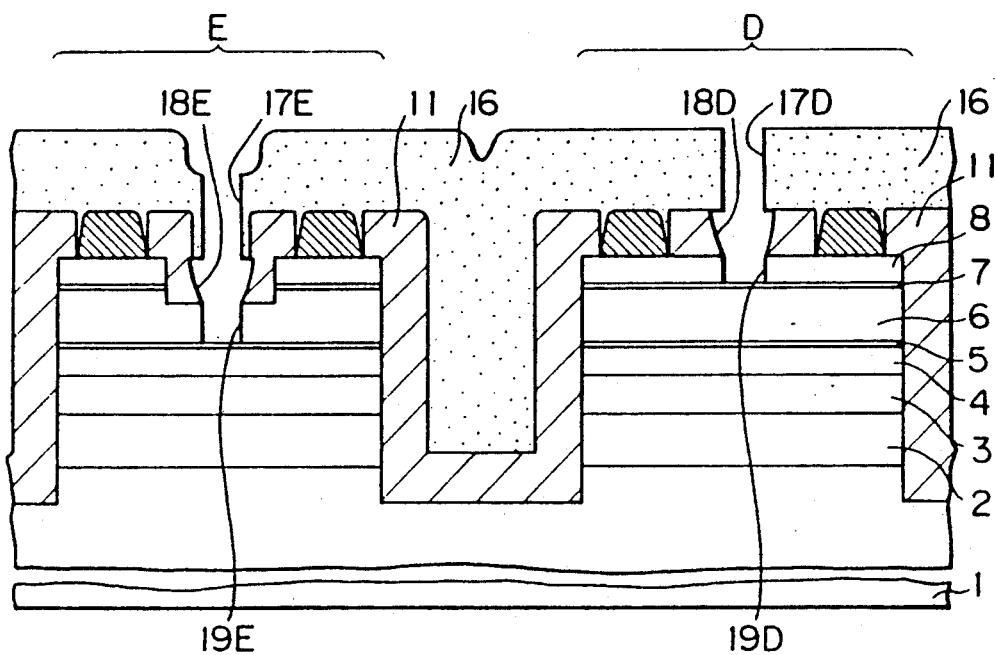
Figure 6:
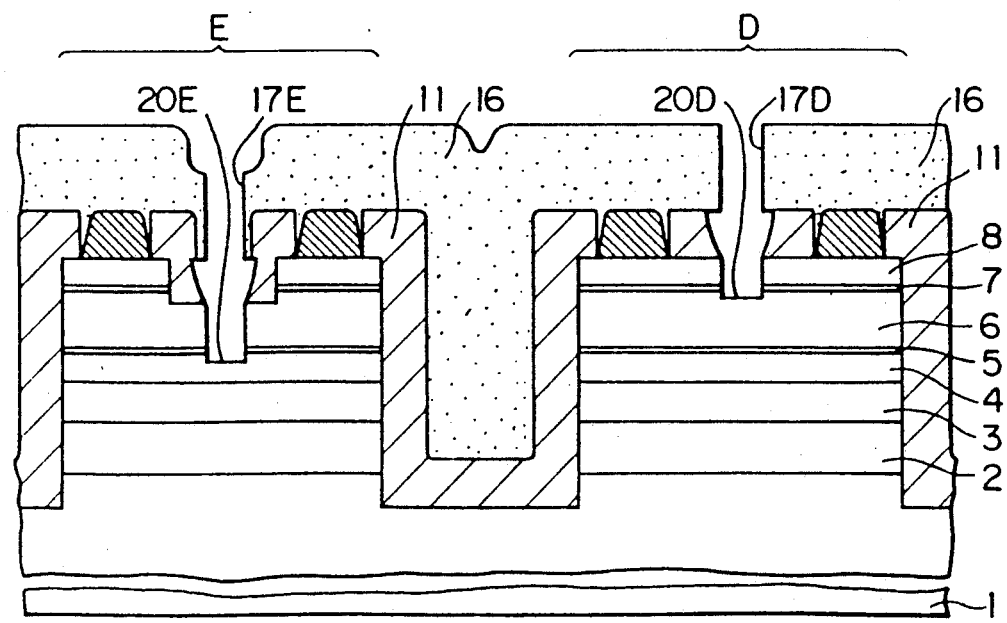
Figure 7:
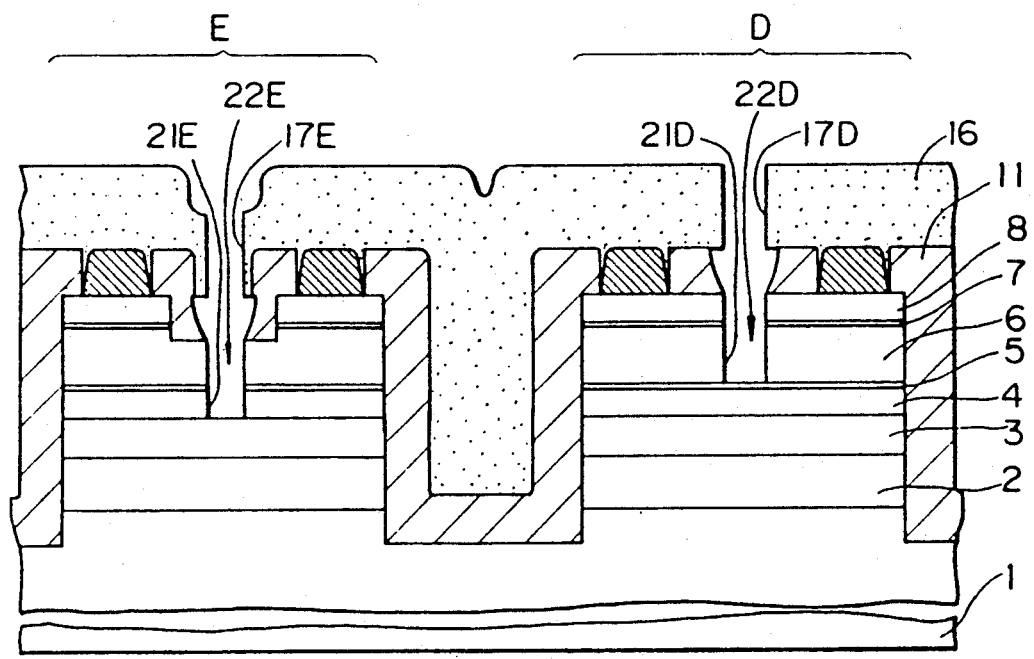
Figure 8:
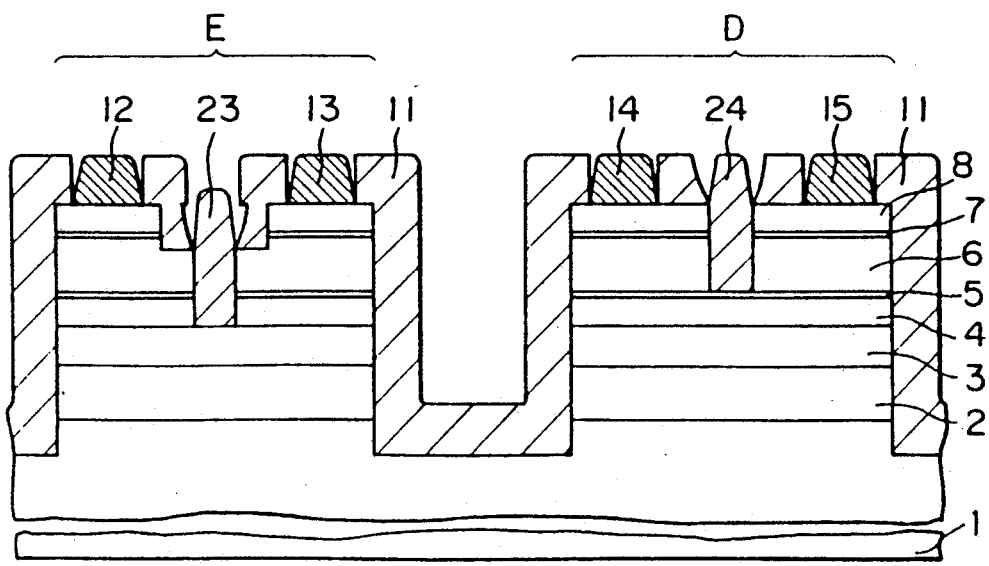
Figure 9:
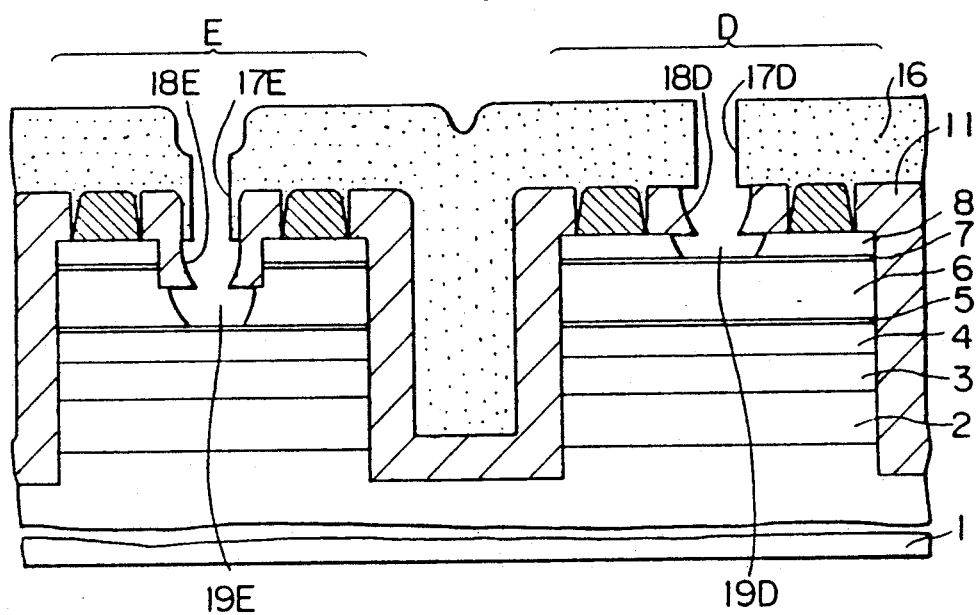
FIGS. 9 and 10 are schematic sectional views of an E/D constitution semiconductor device produced in accordance with a proposed technique.
Figure 10:
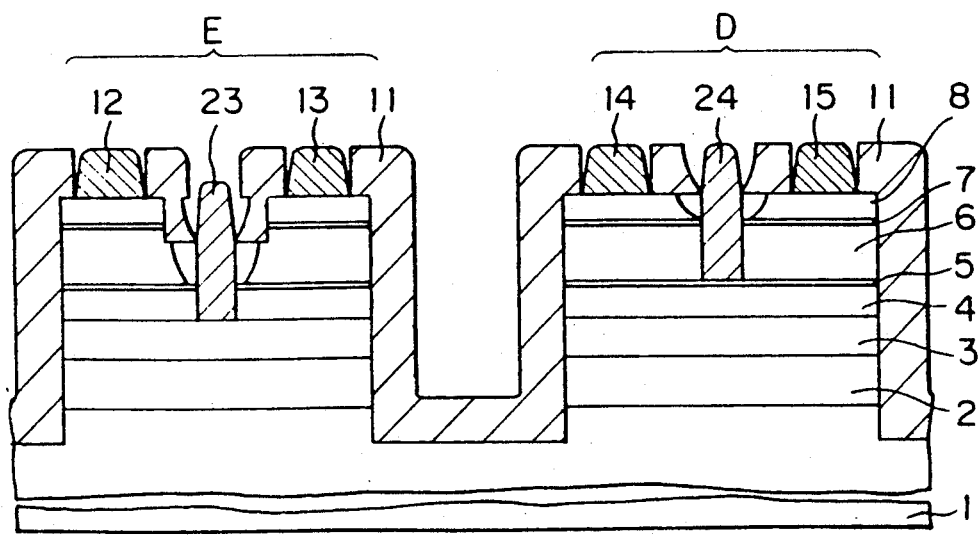
Figure 11:
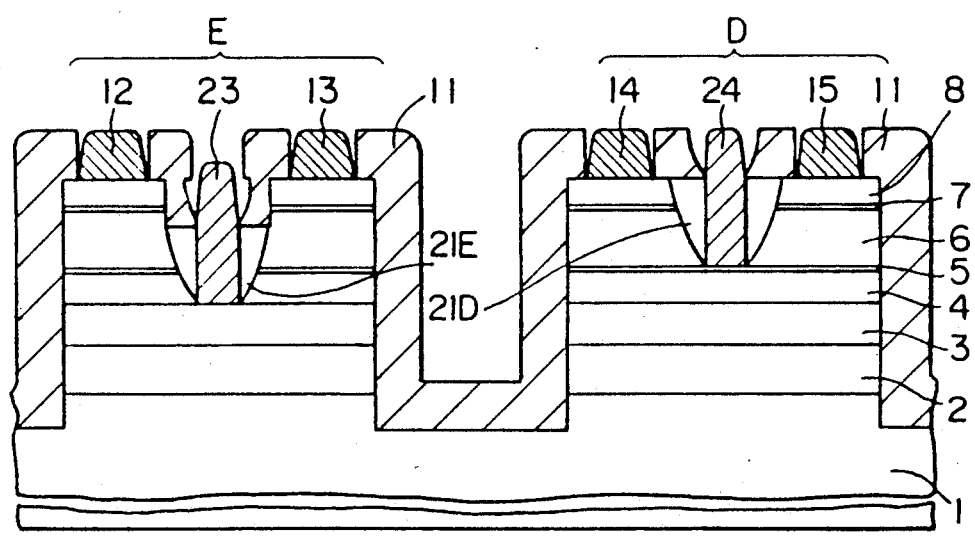
FIG. 11 is a schematic sectional view of an E/D constitution semiconductor device having another gate structure.
Figure 12:
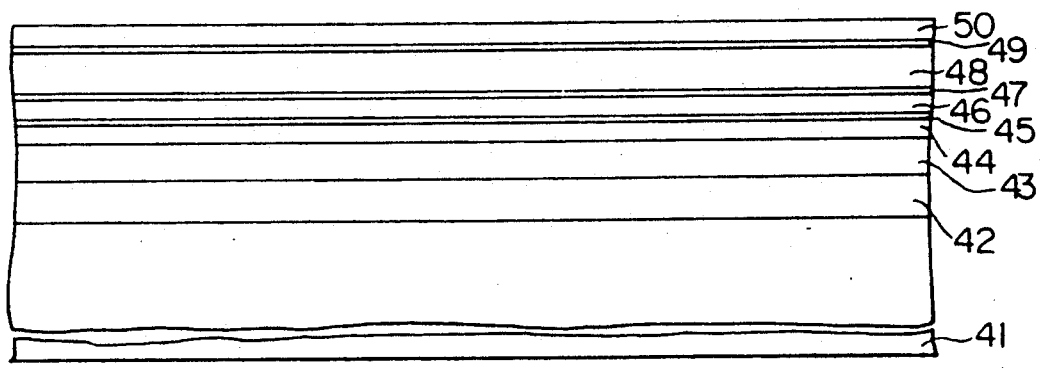
FIGS. 12 through 22 are schematic sectional views of an E/D constitution semiconductor device in various stages of production in accordance with a method of the present invention.

As illustrated in FIG. 12, on a semi-insulating substrate 41, an undoped GaAs channel layer (a first semiconductor layer) 42, an n-type AlGaAs electron-supply layer (a second semiconductor layer) 43, an n-type GaAs threshold voltage adjusting layer (a third semiconductor) 44 for a D-mode transistor, an n-type AlGaAs first etching-stoppable layer (a fourth semiconductor layer) 45, an n-type GaAs lower portion layer 46, an n-type AlGaAs third etching-stoppable layer (an eighth semiconductor layer) 47, an n-type GaAs upper portion layer 48, an n-type AlGaAs second etching-stoppable layer (a sixth semiconductor layer) 49 and an n-type GaAs contact cap layer (a seventh semiconductor layer) 50 are formed (i.e., epitaxially grown) in sequence by an appropriate method, such as a MBE method and a MOCVD method. The lower portion layer 46 and upper portion layer 48 and eighth semiconductor layer 47 correspond to a fifth semiconductor layer of an n-type GaAs ohmic-contactable layer. Preferably, the thickness of the lower portion layer 46 is thinner than a half, particularly one fourth, of that of the upper portion layer 48. The thinner the lower portion layer, the smaller a gate leakage current of the D-mode transistor, with the result that the gate breakdown voltage is improved (increased).

Figure 13:
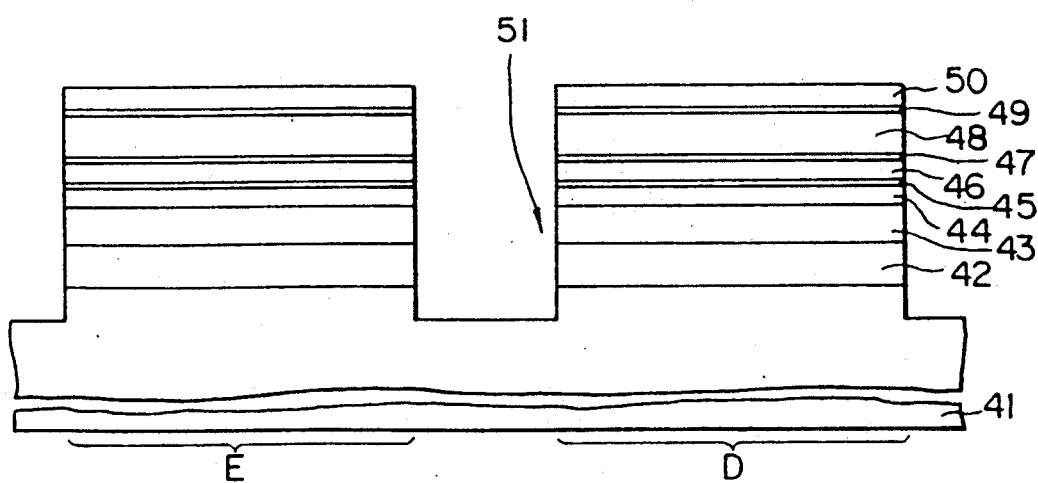

For example, each of the grown semiconductor layers has the following thickness and donor concentration:

(a) Undoped GaAs layer 42:
Thickness: 500 nm
(b) n-type AlGaAs layer 43:
Thickness: 30 nm
Donor concentration: $2 \times 10^{18}$ cm$^{-3}$
(c) n-type GaAs layer 44:
Thickness: 10 nm
Donor concentration: $2 \times 10^{18}$ cm$^{-3}$
(d) n-type AlGaAs layer 45:
Thickness: 5 nm
Donor concentration: $2 \times 10^{18}$ cm$^{-3}$
(e) n-type GaAs layer 46:
Thickness: 15 nm
Donor concentration: $2 \times 10^{18}$ cm$^{-3}$
(f) n-type AlGaAs layer 47:
Thickness: 5 nm
Donor concentration: $2 \times 10^{18}$ cm$^{-3}$
(g) n-type GaAs layer 48:
Thickness: 60 nm
Donor concentration: $2 \times 10^{18}$ cm$^{-3}$
(h) n-type AlGaAs layer 49:
Thickness: 5 nm
Donor concentration: $2 \times 10^{18}$ cm$^{-3}$
(i) n-type GaAs layer 50:
Thickness 40 nm
Donor concentration: $2 \times 10^{18}$ cm$^{-3}$ As illustrated in FIG. 13, to isolate the E-mode FET and the D-mode FET from each other, the semiconductor layers 50 to 42 and the semiconductor substrate 41 are selectively etched by a wet etching method using a suitable etchant, e.g., hydrofluoric acid (HF), to form a groove 51, an E-mode FET region "E" island, and a D-mode FET region "D" island. This groove 51 extends into the substrate 41. In place of the etching treatment an ion-implantation treatment can be adopted. In this case, oxygen ions or protons are doped into the portion corresponding to the groove 51 to form an isolating region.

Figure 14:
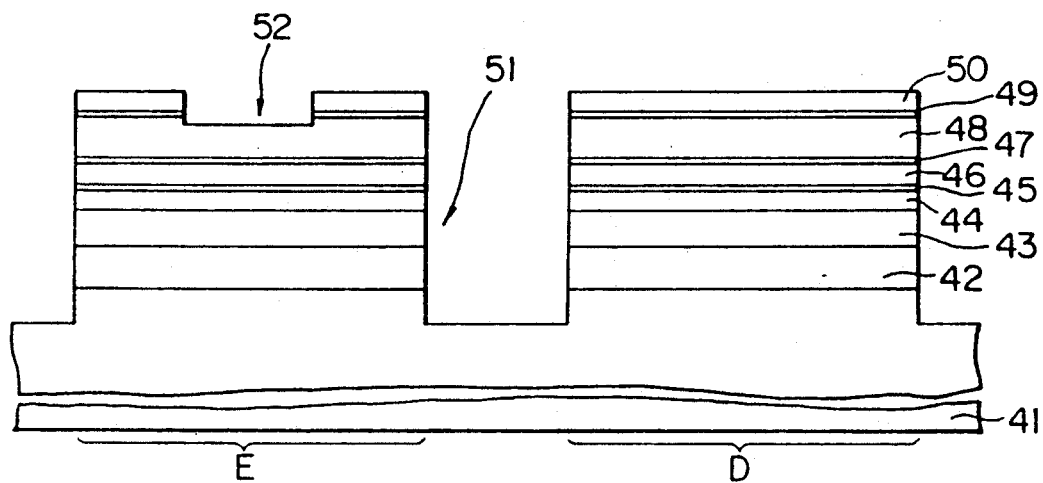

As illustrated in FIG. 14, portions of the n-type GaAs layer 50 and the n-type AlGaAs layer 49 corresponding to a gate region of the E-mode FET are etched by a suitable etching method (e.g., a wet etching method using HF solution) to form a recess 52 in the E region. A portion of the n-type GaAs upper portion layer 48 in the recess 52 is exposed and may be simultaneously etched.

Instead of the above-mentioned etching step, the recess 52 may be formed by a dry etching method, e.g., an RIE method using an etching gas comprising $CCl_2F_2$, to selectively etch the n-type GaAs layer 50, and then a wet etching method using an HF solution to etch the n-type AlGaAs (second etching-stoppable) layer 49.

Figure 15:
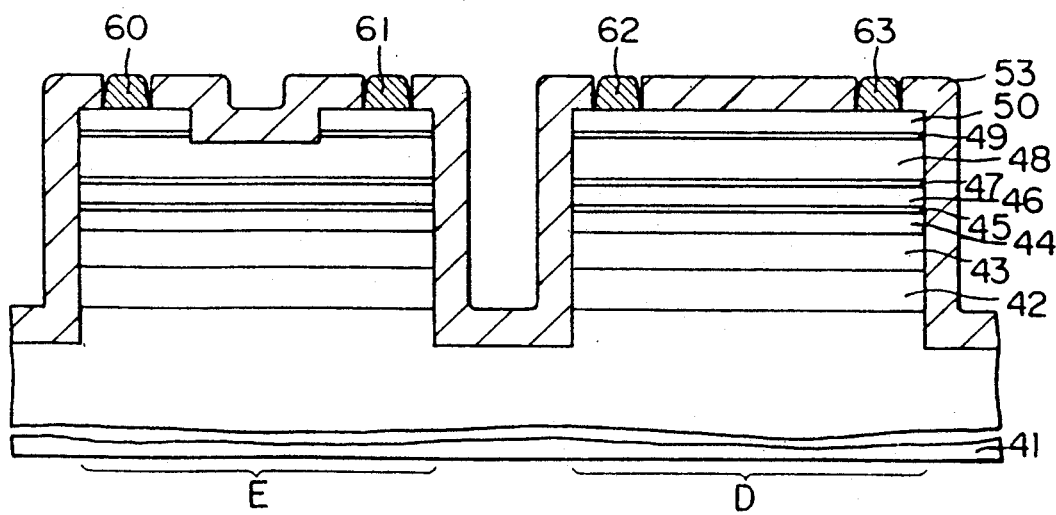

As illustrated in FIG. 15, an insulating layer 53 being of, e.g., silicon dioxide ($SiO_2$), is formed over the whole of the exposed surface by a chemical vapor deposition (CVD) method. The $SiO_2$ layer 53 has a thickness of, e.g., about 300 nm. The insulating ($SiO_2$) layer 53 is coated with a resist layer (not shown) having openings and is then selectively etched by, e.g., a wet etching method using an HF solution, to form contact openings therein. Leaving the resist layer, a metal film of AuGe/Au, AuGe/Ni/Au, AuGe/Ni, or the like is formed on the resist layer and the exposed portions of the seventh n-type GaAs layer 50 in the openings by a vapor deposition method. For example, the AuGe/Au film consists of an AuGe layer having a thickness of about 30 nm and an Au layer having a thickness of 270 nm. The resist layer is then removed by a suitable solvent, whereby a portion of the metal film on the resist layer is also removed. As the result of such a lift-off process, electrode metal portions 60, 61, 62, and 63 remain on the seventh n-type GaAs layer 50. A heat treatment for alloying (e.g., at about 450° C. for 1 minute), is carried out to form ohmic-contact electrodes 60 to 63 of the source and drain electrodes of the E-mode and D-mode FET's.

Figure 16:
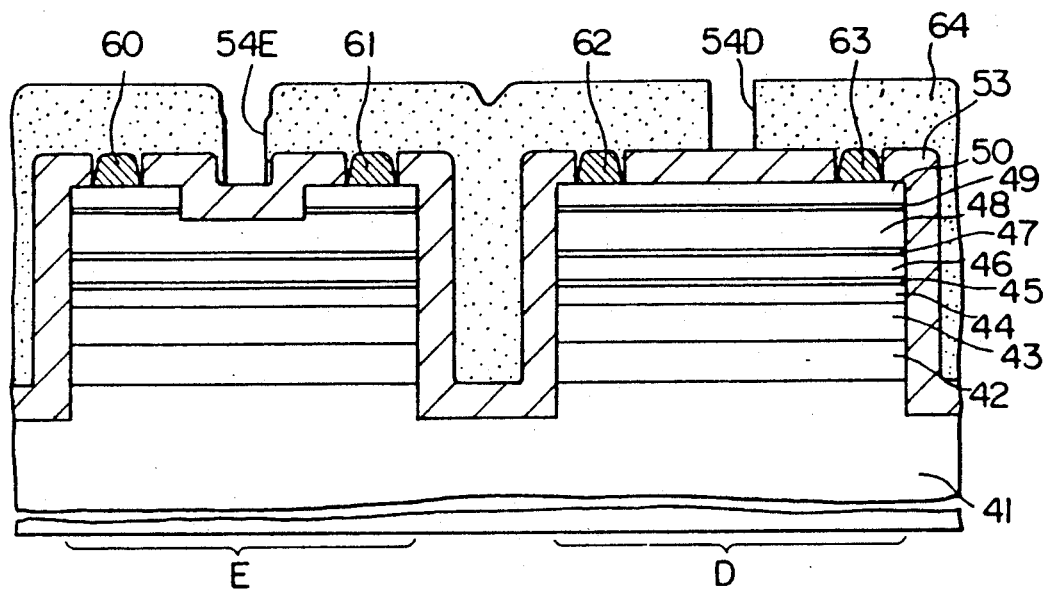

As illustrated in FIG. 16, a resist layer (a masking layer) 64 is coated, exposed, and developed to form openings 54E and 54D for the formation of grooves for gate electrodes of the E-mode and D-mode FET's, respectively.

Figure 17:
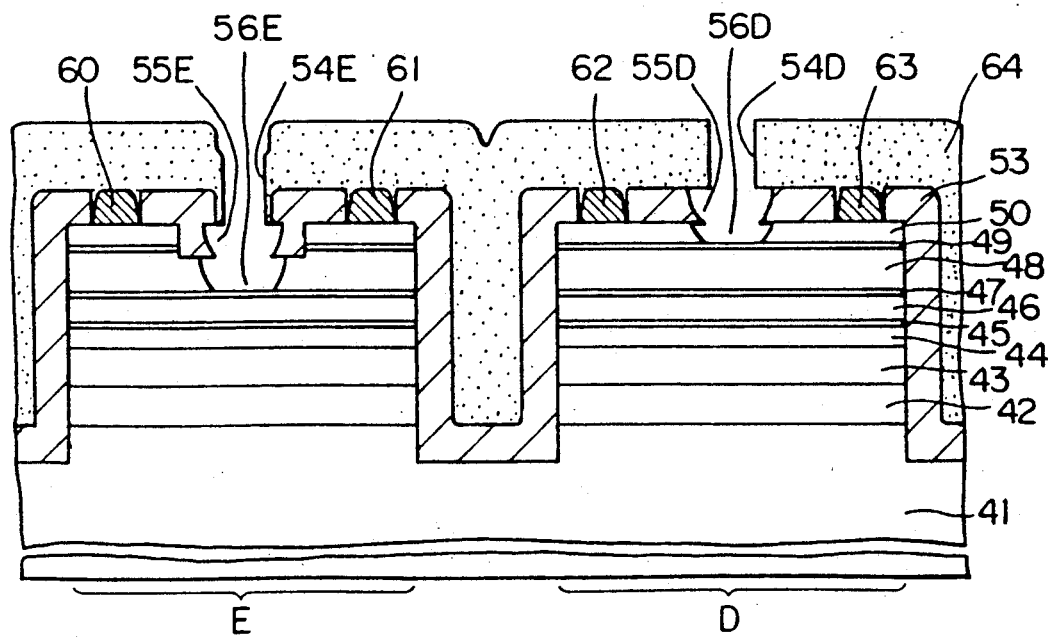

As illustrated in FIG. 17, by using the resist layer 64 as a mask, the SiO$_2$ layer 53 is etched through the openings 54E and 54D by, e.g., a wet etching method using an HF solution, so that openings 55E and 55D are formed in the SiO$_2$ layer 53. The etching of SiO$_2$ may be performed by a RIE method using an etching gas, such as CF$_4$, CHF$_3$, C$_2$F$_6$ and C$_3$F$_8$.

Then a selective dry etching treatment, in this case a reactive ion etching (RIE) treatment using an etchant gas comprising CCl$_2$F$_2$, is performed at a pressure of 20 Pa and a bias voltage of 30 V, so as to isotropically etch the n-type GaAs upper portion layer 48 in the E region through the opening 54E and the seventh n-type GaAs layer 50 in the D region through the opening 54D, to form openings 56E and 56D, respectively. The eighth n-type AlGaAs layer 47 in the E region and the sixth n-type AlGaAs layer 49 in the D region serve as etching-stoppable layers.

If the RIE method using CCl$_2$F$_2$ gas is performed under the conditions of a pressure of 5 Pa and a bias voltage of 100 V, the GaAs can be anisotropically etched. The formation of the openings 56E and 56D can be performed by the anisotropical etching process.

Figure 18:
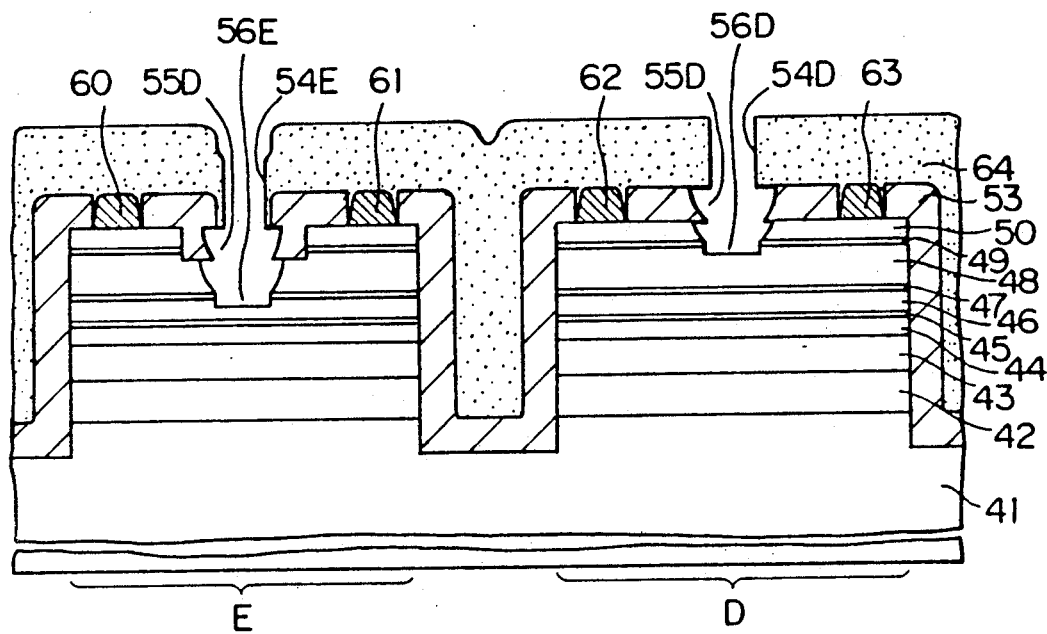

As illustrated in FIG. 18, the exposed portions of the AlGaAs layers 47 and 49 in the openings 54E to 56E and 54D to 56D are etched by, e.g., a wet etching method using an HF solution, to expose the n-type GaAs lower portion layer 46 in the E region and the n-type GaAs upper portion layer 48 in the D region. Since this etching treatment is performed for the purpose of removing a AlGaAs layer, and since the thickness of the AlGaAs layers 47 and 49 is very thin (5 mm), it is easy to control the etching of the AlGaAs layers 47 and 49 without the complete removal of the lower and upper GaAs layers 46 and 48. As a result of the etching, openings 56E and 56D extend through the AlGaAs layers 47 and 49 and into portions of the GaAs layer 46 and 48. It is possible to perform the etching treatment by a dry etching method using an etchant gas, e.g., Ar, He, H$_2$, or BCl$_3$ instead of the wet etching methods. Also, it is possible to use a wet etching of a mixture of I$_2$ and KI, which can etch AlGaAs about 30–40 times faster than GaAs.

Figure 19:
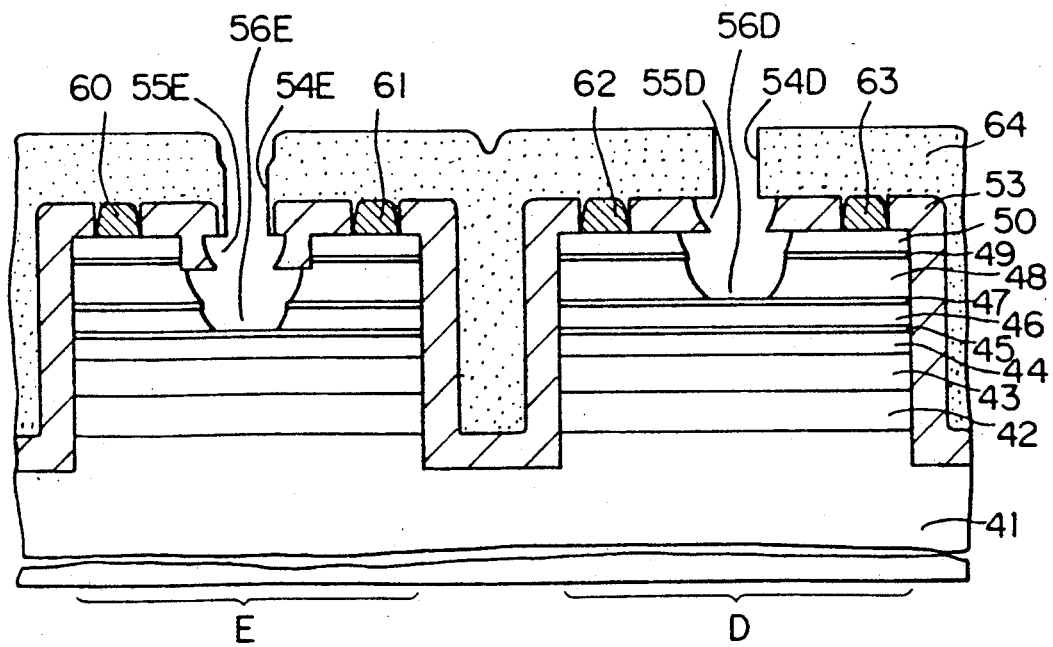

As illustrated in FIG. 19, by using the resist layer 64 as a mask, the exposed portions of the n-type GaAs lower portion layer 46 in the E region and the n-type GaAs upper portion layer 48 are isotropically etched by an RIE method using a CCl$_2$F$_2$ etching gas at a pressure of 20 Pa and at a bias voltage of 30 V, and thus the openings 56E and 56D are further extended, the fourth AlGaAs layer 45 in the E region and the eighth AlGaAs layer 47 in the D region serving as etching-stoppable layers.

Figure 20:
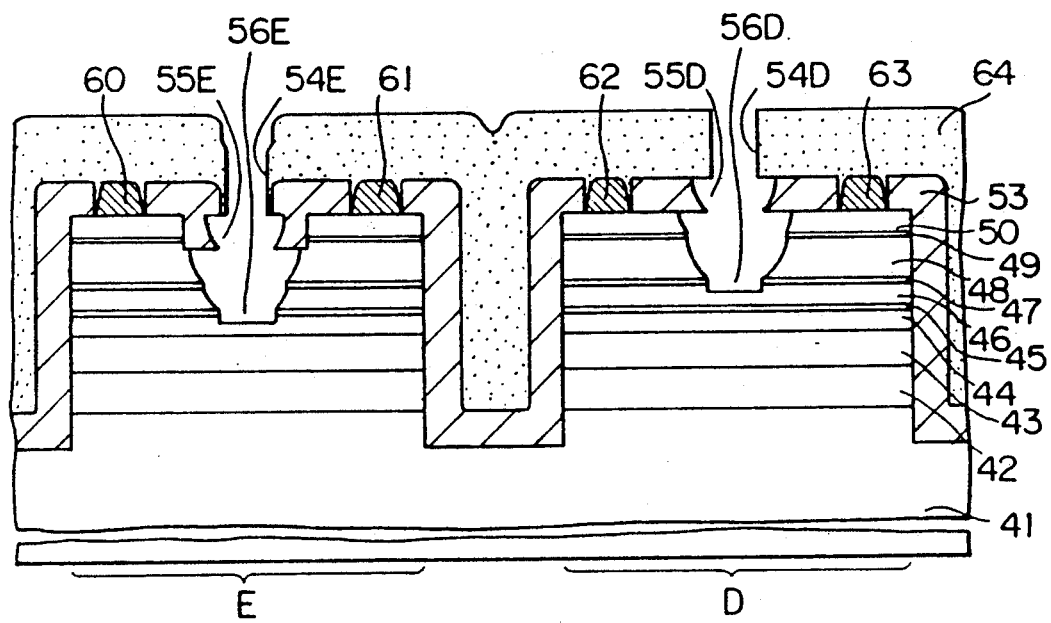

As illustrated in FIG. 20, the AlGaAs (first and third etching-stoppable) layers 45 and 47 are selectively etched by a wet etching method using an HF solution to expose the third n-type GaAs layer 44 in the E region and the n-type GaAs lower portion layer 46 in the D region, and thus the openings 56E and 56D are further extended. A suitable dry etching method may be adopted instead of the wet etching method.

Figure 21:
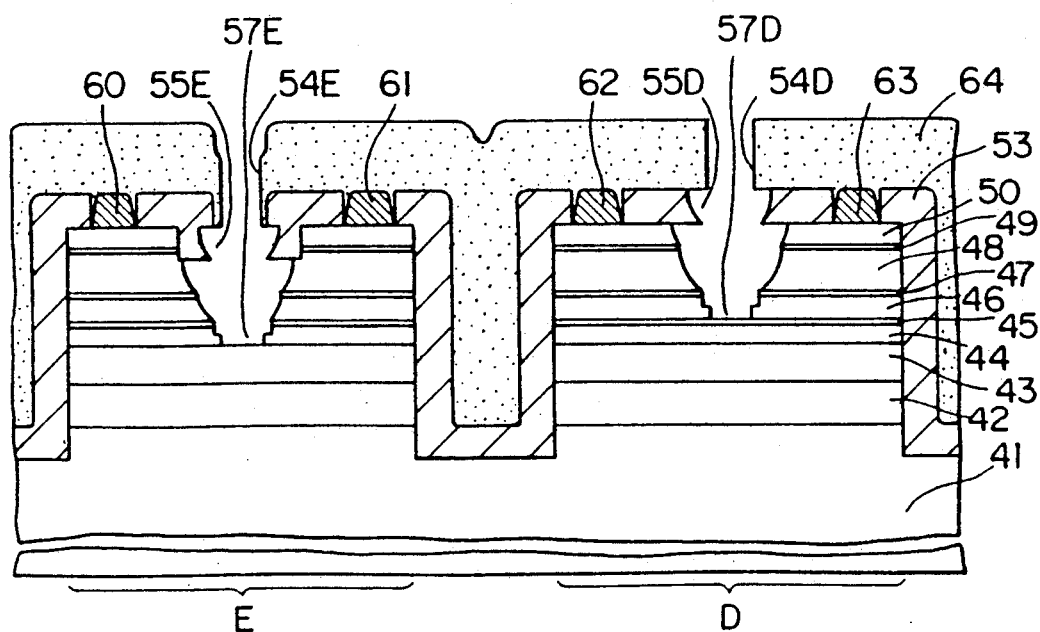

As illustrated in FIG. 21, a selective dry etching (in this case, RIE) treatment using CCl$_2$F$_2$ gas is performed at a pressure of 5 Pa and a bias voltage of 100 V, to anisotropically etch the third GaAs layer 44 in the E region through the opening 56E and n-type GaAs lower portion layer 46 in the D region through the opening 56D, respectively. The second n-type AlGaAs layer 43 in the E region and the fourth n-type AlGaAs layer 45 in the D region serve as etching-stoppable layers. The openings 56E and 56D are extended to complete recesses (grooves) 57E and 57D defining the distances (semiconductor layer thickness) between the undoped GaAs channel layer surface and the bottom of the recesses, which distances obtain the predetermined threshold voltages of the E-mode and D-mode transistors, respectively.

If it is necessary to minutely control the threshold voltage Vth, the exposed second and fourth AlGaAs layers 43 and 55 are slightly etched by a suitable etching method. Even if the fourth AlGaAs layer (first etching-stoppable layer) 45 in the D region is removed to expose the third GaAs (threshold voltage adjusting layer) 44, this causes no problem in the operation of the D-mode transistor.

Figure 22:
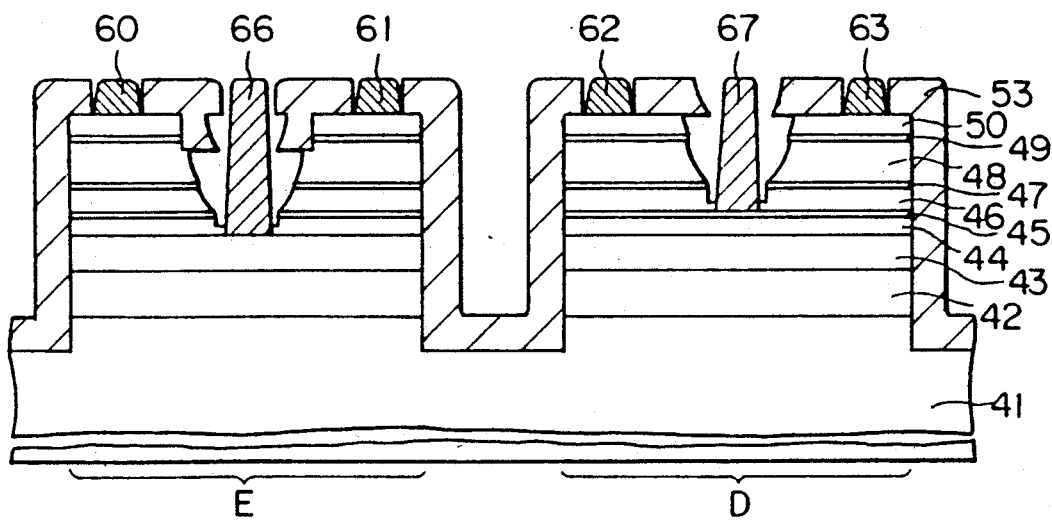

As illustrated in FIG. 22, a metal layer for a Schottky barrier of, e.g., aluminum (Al), is formed by, e.g., a vapor deposition method, on the remaining resist layer 64 and in the recesses 57E and 57D. The thickness of the metal layer is e.g., about 400 nm. The resist layer 64 is then removed by a suitable solvent, whereby a portion of the metal film on the resist layer 64 is also removed. As a result, metal portions, i.e., gate electrodes 66 and 67 of the E-mode and D-mode transistors, respectively, are formed, and thus a semiconductor device comprising the E-mode and D-mode HEMTs is obtained.

Each of the E-mode and D-mode transistors of the obtained E/D constitution semiconductor device has an accurately controlled threshold voltage Vth, high gate breakdown voltage, and low source resistance Rs. The gate electrode 66 of the E-mode transistor is formed such that the side of the electrode 66 does not come into contact with the GaAs layers 46 and 48 corresponding to the fifth ohmic-contactable layer of a conventional E-mode transistor but comes into contact with the threshold voltage adjusting GaAs layer 44, and simultaneously, the gate electrode 67 of the D-mode transistor is formed such that the side of the electrode 67 does not come into contact with the upper portion layer (GaAs layer) 48 but comes into contact with the lower portion layer (GaAs layer) 46 thinner than the layer 48. Therefore, when the gate length of each of the E-mode and D-mode transistors is shortened to 1 μm or less, to increase the operating speed, the source resistance Rs of the E-mode transistor is reduced by increasing the total thickness of the GaAs layers 46 and 48 without increase of the parasitic capacitance and without an extension of a surface depletion layer to the channel layer 42, and simultaneously, the gate leakage current of the D-mode transistor is reduced to increase the gate breakdown voltage. Namely, the gate breakdown voltage of the D-mode transistor can be improved without a deterioration of the properties of the E-mode transistor. Furthermore, the E-mode and D-mode transistors are easily, simultaneously and self-aligningly formed on the same substrate in a manner similar to that used in the conventional case.

It will be obvious that the present invention is not restricted to the above-mentioned embodiment and that many variations are possible for those skilled in the art without departing from the scope of the present invention. For example, the conductivity type of the grown semiconductor layers 44 to 50 can be changed from n-type to p-type. In this case, a two-dimensional hole gas is generated in the channel layer 42. If the electron affinity of the second (electron-supply) layer 43 is smaller than that of the first (channel) layer 42 and the lattice constant of the electron-supply layer 43 is equal or similar to that of the channel layer 42, germanium (Ge), indium-antimonide (InSb), or indium-arsenide(InAs) may be used for the channel layer 42 and AlGaAs, GaAs, cadmium-telluride (CdTe), or gallium-antimonide (GaSb) may be used for the electron-supply layer 43. It is possible to use combinations of Ge (first layer) and AlGaAs (second layer), Ge and GaAs, InSb and CdTe, and InAs and GaSb in addition to the combination of GaAs and AlGaAs. The layers 44, 46, 48 and 50 may be made of Ge, InSb, or InAs and the etching-stoppable layers 45, 47 and 49 may be made of AlGaAs, CdTe, or GaSb. It is possible to adopt a suitable etchant in accordance with compound semiconductor materials used for a semiconductor device according to the present invention.

I claim:

1. A semiconductor device comprising an enhancement-mode transistor and a depletion-mode transistor and utilizing a two-dimensional carrier gas, comprising:
   a semi-insulating substrate;
   a first semiconductor layer including a channel layer;
   a second semiconductor layer having an electron affinity smaller than that of said first semiconductor layer;
   a third semiconductor layer including a threshold voltage adjusting layer for the depletion-mode transistor and having an etch rate larger than that of said second semiconductor layer;
   a fourth semiconductor layer including a first etching-stoppable layer;
   a fifth semiconductor layer including an ohmic-contactable layer and having an etch rate larger than that of said fourth semiconductor layer;
   a sixth semiconductor layer including a second etching-stoppable layer;
   and a seventh semiconductor layer including a contact cap layer and having an etch rate larger than that of said sixth semiconductor layer, said first through seventh semiconductor layers being epitaxially and successively formed on said substrate;
   source and drain electrodes at least partially lying on said seventh semiconductor layer;
   a first gate electrode for the enhancement-mode transistor formed in a first recess extending to said second semiconductor layer;
   a second gate electrode for the depletion-mode transistor formed in a second recess extending to said fourth semiconductor layer,
   an eighth semiconductor layer including a third etching-stoppable layer and having an etch rate smaller than that of said fifth semiconductor layer and formed in the fifth semiconductor layer so as to divide said fifth semiconductor layer into an upper portion layer and a lower portion layer thinner than said upper portion layer, said first gate electrode does not contact said fourth through seventh semiconductor layers and said second gate electrode does not contact said eighth semiconductor layer, said upper portion layer, and said sixth and seventh semiconductor layers.

2. A semiconductor device according to claim 1, wherein each of said first and second gate electrodes has a gate length of 1 $\mu$m or less.

3. A semiconductor device according to claim 1, wherein a thickness of said lower portion layer is smaller than a half of a thickness of said upper portion layer.

4. A semiconductor device according to claim 3, wherein said thickness of said lower portion layer is smaller than one fourth of said thickness of said upper portion layer.

5. A semiconductor device according to claim 1, wherein the two-dimensional carrier gas is a two-dimensional electron gas.

6. A semiconductor device according to claim 5, wherein the transistors are high electron mobility transistors.

7. A semiconductor device according to claim 1, wherein said first, third, fifth and seventh semiconductor layers include GaAs and the second, fourth, sixth and eighth semiconductor layer include AlGaAs.

8. A semiconductor device including an enhancement-mode transistor and a depletion-mode transistor, comprising:
   a semi-insulating substrate;
   a channel layer formed on said semi-insulating substrate;
   a carrier-supply layer formed on said channel layer and having an electron affinity smaller than that of said first semiconductor layer;
   a threshold voltage adjusting layer formed on said carrier-supply layer and having an etch rate larger than that of said carrier-supply layer;
   a first etch-stop layer formed on said threshold voltage adjusting layer;
   a first ohmic-contactable layer formed on said first etch-stop layer and having an etch rate larger than that of said first etch-stop layer;
   a second etch-stop layer formed on said first ohmic-contactable layer;
   a second ohmic-contactable layer formed on said second etch-stop layer and having an etch rate larger than that of said second etch-stop layer;
   a third etch-stop layer formed on said second ohmic-contactable layer;
   a contact cap layer formed on said third etch-stop layer and having an etch rate larger than that of said third etch-stop layer;
   source and drain electrodes at least partially lying on said contact cap layer;
   a first gate electrode for the enhancement-mode transistor formed in a first recess extending to said carrier-supply layer, said first gate electrode does not contact said first etch-stop layer, said first ohmic-contactable layer, said second etch-stop layer, said second ohmic-contactable layer, said third etch-stop layer and said contact cap layer;
   a second gate electrode for the depletion-mode transistor formed in a recess extending to said first etch-stop layer, said second gate electrode does not contact said second etch-stop layer, said second ohmic-contactable layer, said third etch-stop layer and said contact cap layer.

* * * * *